United States Patent
Ikuta (10) Patent No.: US 7,879,632 B2
(45) Date of Patent: Feb. 1, 2011

(54) METHOD FOR MANUFACTURING SURFACE-EMITTING LASER

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 399 days.

(21) Appl. No.: 12/166,378

(22) Filed: Jul. 2, 2008

(65) Prior Publication Data

US 2009/0035884 A1     Feb. 5, 2009

(30) Foreign Application Priority Data

Jul. 31, 2007   (JP)   ............... 2007-198489

(51) Int. Cl.
*H01L 21/00* (2006.01)
(52) U.S. Cl. .............. 438/29; 438/47; 372/44.011; 372/50.124; 257/E33.003; 257/E33.049
(58) Field of Classification Search .......... 438/29, 438/47; 372/44.011, 50.124; 257/E33.003, 257/E33.049
See application file for complete search history.

(56) References Cited

U.S. PATENT DOCUMENTS

| | | | |
|---|---|---|---|
| 5,896,408 A | 4/1999 | Corzine et al. | 372/46 |
| 6,778,581 B1 | 8/2004 | Lipson | 372/96 |
| 7,697,586 B2 * | 4/2010 | Ikuta | 372/50.124 |
| 2005/0158902 A1 | 7/2005 | Chua et al. | 438/32 |
| 2006/0093008 A1 | 5/2006 | Mochizuki | 372/50.23 |
| 2006/0245464 A1 | 11/2006 | Hori et al. | 372/99 |
| 2007/0036189 A1 | 2/2007 | Hori et al. | 372/50.11 |
| 2007/0177647 A1 * | 8/2007 | Noda et al. | 372/50.1 |

(Continued)

FOREIGN PATENT DOCUMENTS

JP          11-103129 A     4/1999

(Continued)

OTHER PUBLICATIONS

H.J. Unold et al., "Photonic Crystal Surface-Emitting Lasers: Tailoring Waveguiding for Single-Mode Emission," Proceedings of 27th European Conference on Optical Communication (ECOC'01—Amsterdam), Sep. 30-Oct. 4, 2001, IEEE, pp. 520-521.

(Continued)

*Primary Examiner*—Mary Wilczewski
*Assistant Examiner*—Toniae M Thomas
(74) *Attorney, Agent, or Firm*—Fitzpatrick, Cella, Harper & Scinto (57) ABSTRACT

Provided is a method for manufacturing a surface-emitting laser capable of forming a photonic crystal structure inside a semiconductor highly accurately and easily without direct bonding. It is a method for laminating on a substrate a plurality of semiconductor layers including an active layer and a semiconductor layer having a photonic crystal structure formed therein, the method including the steps of forming a second semiconductor layer on a first semiconductor layer to form the photonic crystal structure, forming a plurality of microholes in the second semiconductor layer, forming a low refractive index portion in a part of the first semiconductor layer via the plurality of microholes thereby to provide the first semiconductor layer with the photonic crystal structure having a one-dimensional or two-dimensional refractive index distribution in a direction parallel to the substrate, and forming a third semiconductor layer by crystal regrowth from a surface of the second semiconductor layer.

7 Claims, 7 Drawing Sheets

U.S. PATENT DOCUMENTS

| | | | |
|---|---|---|---|
| 2008/0107145 A1 | 5/2008 | Hori et al. | 372/99 |
| 2008/0112442 A1 | 5/2008 | Ikuta | 372/19 |
| 2008/0117942 A1 | 5/2008 | Nagatomo et al. | 372/19 |
| 2008/0164560 A1 | 7/2008 | Almuneau et al. | 257/506 |
| 2008/0240193 A1* | 10/2008 | Noda et al. | 372/49.01 |
| 2009/0034572 A1* | 2/2009 | Ikuta | 372/46.013 |
| 2010/0046570 A1* | 2/2010 | Ikuta | 372/50.124 |

FOREIGN PATENT DOCUMENTS

| | | |
|---|---|---|
| JP | 2000-332351 | 11/2000 |
| JP | 2000-353858 A | 12/2000 |
| JP | 2006/0332598 A | 12/2006 |
| WO | WO 2006/082322 A1 | 8/2006 |

OTHER PUBLICATIONS

K. Swaminathan et al., "Investigation of the III-V Oxidation Process for the Fabrication of Sub-Micron Three Dimensional Photonic Devices," Proceedings of the SPIE—The International Society for Optical Engineering, vol. 6110, pp. 61100P-1 to 61100P-3, Jan. 23, 2006.

K. Streubel et al., "1.26μm vertical cavity laser with two InP/air-gap reflectors," Electronics Letters, vol. 32, No. 15, Jul. 18, 1996, pp. 1369-1370.

* cited by examiner

METHOD FOR MANUFACTURING SURFACE-EMITTING LASER

BACKGROUND OF THE INVENTION

1. Field of the Invention

The present invention relates to a method for manufacturing a surface-emitting laser.

2. Description of the Related Art

Recently, attentions have been paid to a surface-emitting laser as a light source for optical communications or optical transmission or a light source of electronic photographs. The surface-emitting laser has such excellent properties that two-dimensional array is easily obtained and that it has a low threshold value and a single longitudinal mode. As such a surface-emitting laser, a photonic crystal surface-emitting laser has been developed which utilizes photonic crystals. Here, the photonic crystal is a structure having a refractive index periodicity equal to or smaller than that of light wavelength.

As for such a surface-emitting laser, a two-dimensional photonic crystal surface-emitting laser and its manufacturing method utilizing photonic crystals are disclosed in Japanese Patent Application Laid-Open No. 2000-332351 (Patent Document 1). The two-dimensional photonic crystal surface-emitting laser disclosed in Patent Document 1 has a photonic crystal periodic structure in which a refractive index periodicity is provided two-dimensionally in the vicinity of an active layer that emits light by carrier implantation, and is configured to cause resonance by the photonic crystal to generate surface emission.

Figure 12A:
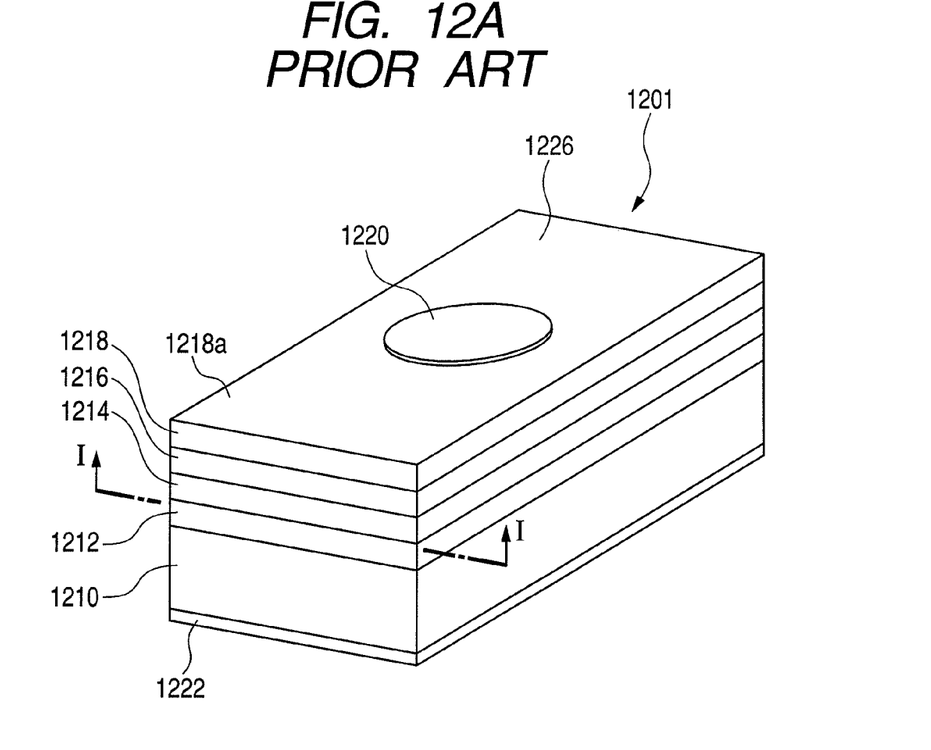
FIGS. 12A and 12B are schematic diagrams each for explaining a conventional method for manufacturing a surface-emitting laser.
Figure 12B:
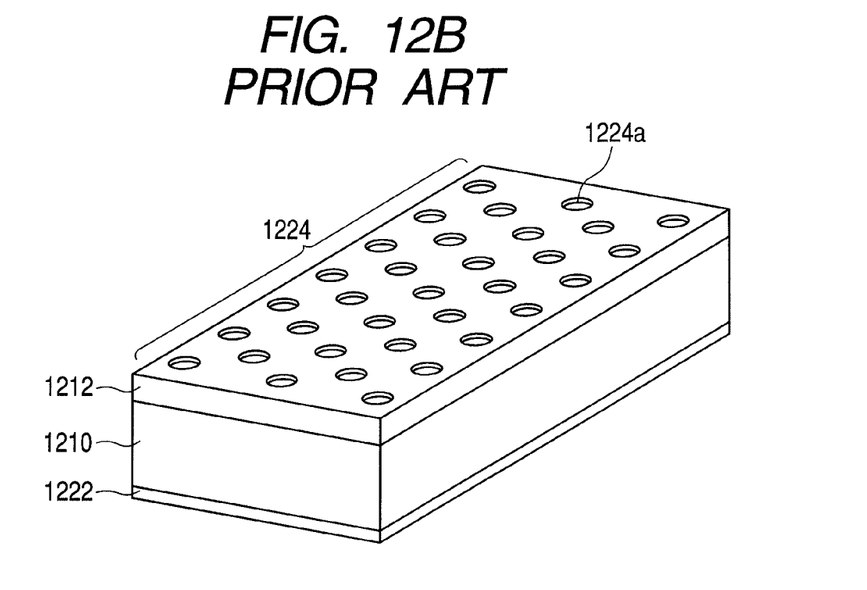

More specifically, the surface-emitting laser of Patent Document 1 has, as illustrated in FIGS. 12A and 12B, a lower cladding layer 1212, an active layer 1216 and an upper cladding layer 1218 laminated on a substrate 1210. This lower cladding layer 1212 has a two-dimensional photonic crystal embedded in the vicinity of the active layer. On the upper cladding layer 1218, an upper electrode 1220 is arranged, while a lower electrode 1222 is arranged on the substrate 1210. When a voltage is applied to between the upper electrode 1220 and the lower electrode 1222 to inject carriers in the active layer 1216, the active layer emits light to cause laser oscillation by light resonance of the two-dimensional photonic crystal. In addition, Patent Document 1 also discloses the following manufacturing method of a semiconductor surface-emitting device applicable to the surface-emitting laser.

The manufacturing method of a semiconductor surface-emitting device has the following steps.

The steps are: a step of preparing a first piece having a first surface including a first substrate; a step of laminating a first conductive semiconductor layer, an active layer and a second conductive semiconductor layer sequentially on a main surface of a second substrate to form a second piece having a second surface along an extending direction of the main surface; a grating step of forming a two-dimensional diffraction grating in at least one of the first surface and the second surface; and a step of, after the grating step, bonding the first piece and the second piece in such a manner that the first surface and the second surface face each other.

Specifically, this manufacturing method of a semiconductor light-emitting device uses a method of directly bonding the semiconductor piece having a photonic crystal structure formed on its surface to another semiconductor piece via the surface having the photonic crystal structure formed thereon.

This method is said to be applicable to the surface-emitting laser because this enables manufacturing of a device having a photonic crystal structure inside the semiconductor.

SUMMARY OF THE INVENTION

In the manufacturing method of a semiconductor light-emitting device as disclosed in Patent Document 1, direct bonding as described above is used as a method of forming the photonic crystal structure inside the semiconductor.

However, the direct bonding process has some difficulty associated with semiconductor materials, and even if the bonding itself is possible, it is difficult to insure accuracy in positioning, alignment and leaning of both pieces to be bonded.

For example, when a laser resonator is provided across the both pieces (a photonic crystal structure is provided on the first piece, a multi-layer reflecting mirror is provided on the second piece, and these are bonded to constitute a resonator), laser performance varies depending on the positioning accuracy. Therefore, the method for manufacturing a surface-emitting laser including the direct bonding step imposes limitations of device materials and design.

In view of the above-mentioned problem, the present invention has an object to provide a method for manufacturing a surface-emitting laser capable of forming a photonic crystal structure inside a semiconductor highly accurately and easily without direct bonding.

In order to solve the above-mentioned problem, the present invention provides a method for manufacturing a surface-emitting laser.

The method of the present invention is a method for manufacturing a surface-emitting laser by laminating on a substrate a plurality of semiconductor layers including an active layer and a semiconductor layer having a photonic crystal structure formed therein, the method comprising the steps of: forming a second semiconductor layer on a first semiconductor layer to form the photonic crystal structure; forming a plurality of microholes in the second semiconductor layer; forming a low refractive index portion in a part of the first semiconductor layer via the plurality of microholes thereby to provide the first semiconductor layer with the photonic crystal structure having a one-dimensional or two-dimensional refractive index distribution in a direction parallel to the substrate; and forming a third semiconductor layer by crystal regrowth from a surface of the second semiconductor layer.

According to the present invention, it is possible to form the photonic crystal structure inside the semiconductor highly accurately and easily without direct bonding.

Further features of the present invention will become apparent from the following description of exemplary embodiments with reference to the attached drawings.

DESCRIPTION OF THE EMBODIMENTS

Embodiments of the present invention will be now described with reference to the drawings.

The description below explains embodiments of a method for manufacturing a surface-emitting laser of the present invention structured by laminating on a substrate semiconductors including an active layer and a first semiconductor layer in which a first photonic crystal structure is formed having a one-dimensional or two-dimensional refractive index distribution in a direction parallel to the substrate.

Here, these are illustrated in FIGS. 1 to 11, in which like or corresponding portions are indicated by like reference numerals.

First Embodiment

Now, description is made about the method for manufacturing a surface-emitting laser according to the first embodiment of the present invention.

Figure 1:
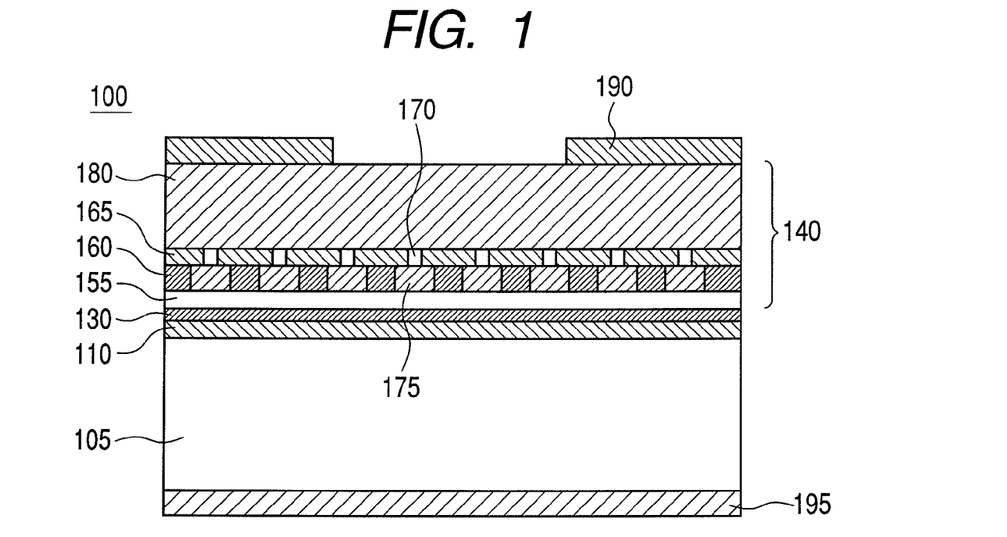
FIG. 1 is a schematic diagram for explaining the structure of a surface-emitting laser manufactured by a method according to a first embodiment of the present invention.

FIG. 1 is a schematic diagram of a structure of the surface-emitting laser manufactured by the method of the present embodiment.

In FIG. 1, reference numeral 100 denotes a surface-emitting laser, 105 denotes a substrate, 110 denotes a lower cladding layer, and 130 denotes an active layer.

140 denotes an upper cladding layer, 155 denotes a first upper cladding layer, 160 denotes a second upper cladding layer, and 165 denotes a third upper cladding layer.

170 denotes a microhole, 175 denotes a low refractive index portion of a photonic crystal structure, 180 denotes a fourth upper cladding layer, 190 denotes an upper electrode and 195 denotes a lower electrode.

The surface-emitting laser 100 of this embodiment has a structure in which the lower cladding layer 110, the active layer 130 and the upper cladding layer 140 are laminated on the substrate 105.

The upper cladding layer 140 has the first upper cladding layer 155, the second upper cladding layer 160 with the photonic crystal structure formed therein, the third upper cladding layer 165 having the microholes 170 formed therein and the fourth upper cladding layer 180.

The second upper cladding layer 160 is structured of a first semiconductor layer of plural semiconductor layers which constitute the surface-emitting laser.

This second upper cladding layer 160 has a low refractive index portion 175 of which the refractive index is lower than that of the surrounding semiconductor layer. With this structure, the two-dimensional photonic crystal structure having a two-dimensional refractive index distribution in a direction parallel to the substrate is constituted.

Here, the microhole 170 extends from the low refractive index portion 175 to the surface of the third upper cladding layer 165.

The microhole has a cross section in the direction parallel to the substrate 105 which is smaller than the cross section in the direction parallel to the substrate 105 of the low refractive index portion 175 in the second upper cladding layer 160.

Further, on the surface of the fourth upper cladding layer 180, there is provided the ring-shaped upper electrode 190, while the lower electrode 195 is provided on the substrate 105.

With this surface-emitting laser 100, when a voltage is applied to between the electrodes 190 and 195, the active layer 130 emits light, and light leaking from the active layer 130 resonates to be amplified in the two-dimensional photonic crystal structure.

Then, the coherent light is emitted from an upper surface of the fourth upper cladding layer 180.

Next description is made about the method for manufacturing the surface-emitting laser according to this embodiment.

Figure 2:
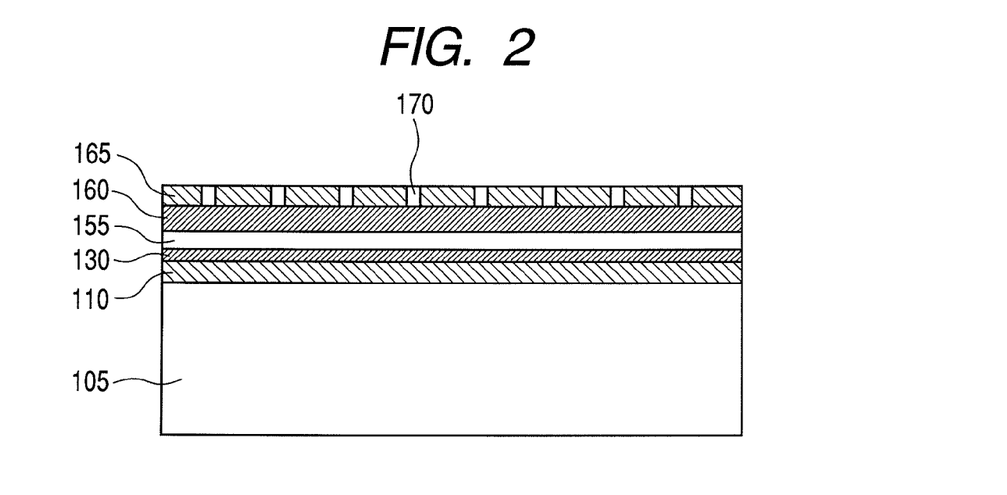
FIG. 2 is a schematic diagram for explaining the method for manufacturing a surface-emitting laser according to the first embodiment of the present invention.
Figure 3:
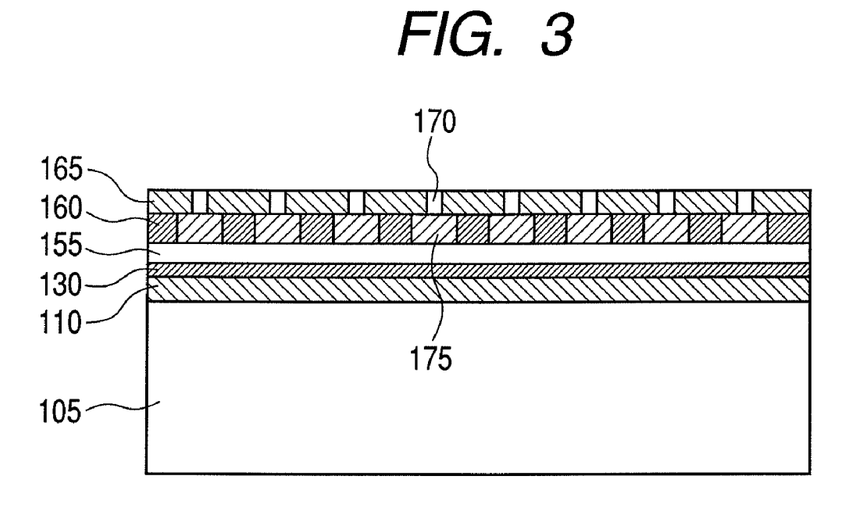
FIG. 3 is a schematic diagram for explaining the step of forming a two-dimensional photonic crystal structure in an upper cladding layer in the method of manufacturing a surface-emitting laser according to the first embodiment of the present invention.
Figure 4:
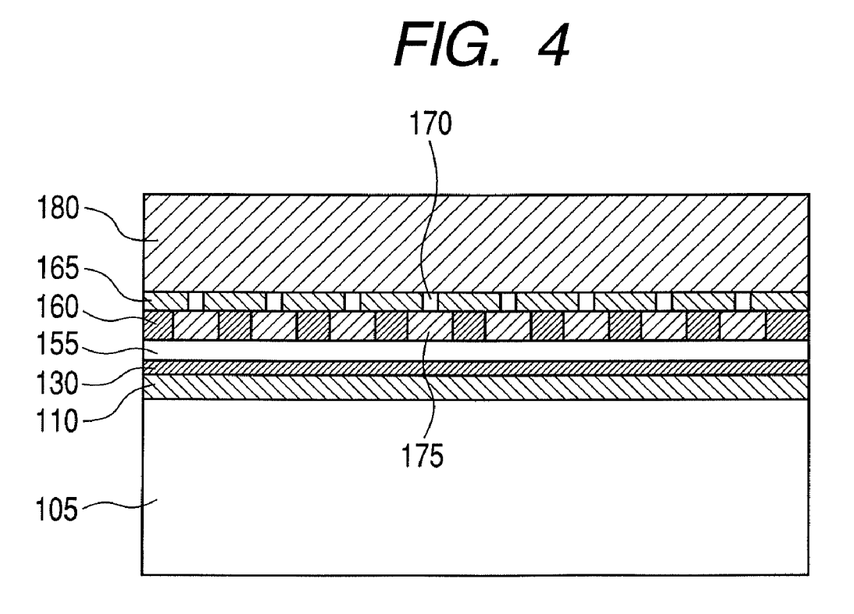
FIG. 4 is a schematic diagram for explaining a structural example of a fourth upper cladding layer formed on a third upper cladding layer by semiconductor crystal regrowth in the method of manufacturing a surface-emitting laser according to the first embodiment of the present invention.

FIGS. 2 to 4 are diagrams for explaining the method for manufacturing the surface-emitting laser according to this embodiment. First, as shown in FIG. 2, on the semiconductor substrate 105, the lower cladding layer 110, the active layer 130, the first upper cladding layer 155, and the second upper cladding layer 160 in which the photonic crystal structure is formed (first semiconductor layer), the third upper cladding layer 165 in which microhole 170 is formed (second semiconductor layer) are laminated in this order. Each layer is laminated, for example, using MOCVD (Metal Organic Chemical Vapor Deposition).

The semiconductor 105 used is an n-type semiconductor substrate, for example, n-GaAs substrate.

The lower cladding layer 110 used is an n-type AlGaAs, for example, n-Al0.9Ga0.1As.

The active layer 130 used is, for example, GaInP/AlGaInP having a quantum well structure.

The first upper cladding layer 155, the second upper cladding layer 160 and the third upper cladding layer 165 used are p-type AlGaAs.

The second upper cladding layer 160 is structured to have an Al compositional ratio higher than those of the first upper cladding layer and the third upper cladding layer.

For example, the first upper cladding layer 155, the second upper cladding layer 160, the third upper cladding layer 165 are, for example, p-Al0.5Ga0.5As, p-Al0.96Ga0.04As, p-Al0.7Ga0.3As, respectively.

In the method for manufacturing the surface-emitting laser according to the present embodiment, the following steps are performed to form the plural microholes 170.

First, on the upper cladding layer 160 (first semiconductor layer), the third upper cladding layer 165 (second semiconductor layer) is formed.

Next, from the surface of the third upper cladding layer 165, the plural microholes 170 are formed in the third upper cladding layer 165 and the second upper cladding layer 160.

To be specific, a resist is applied on the surface of this third upper cladding layer 165 to form a two-dimensional microhole pattern.

For example, the two-dimensional microhole pattern is in the shape of a tetragonal lattice and the lattice spacing is 250 nm, for example.

The diameter of each microhole is, for example, 50 nm.

The resist having the two-dimensional microhole pattern formed therein is used as a mask to form the microholes 170 by ICP etching method with use of chlorine gas.

The formation of the microholes 170 is so controlled that the microholes 170 penetrate through the third upper cladding layer 165 but do not reach the active layer 130.

Then, the plural microholes are used to form in a part of the first semiconductor layer low refractive index portions 175 of which the refractive index is lower than that of the surrounding semiconductor layer so that the two-dimensional crystal structure is formed having a two-dimensional refractive index distribution in the direction parallel to the substrate.

For example, oxidizing species are introduced via the microholes to form an oxidized area by the oxidizing species so that low refractive index portions 175 having a refractive index lower than that of the surrounding semiconductor layer are formed in the part of the first semiconductor layer.

Specifically, the resist is removed, vapor is introduced via the microholes and thermal processing is performed at a temperature of 450° C. Then, as shown in FIG. 3, a two-dimension photonic crystal structure is formed in the second upper cladding layer 160.

In other words, parts of the second upper cladding layer 160 in contact with the microholes 170 are oxidized to form an Al oxide having a refractive index lower than that of the surrounding second upper cladding layer 160. These parts correspond to the low refractive index portions 175 of the two-dimensional photonic crystal structure. Thus, the two-dimensional photonic crystal structure is formed in the second upper cladding layer 160 (first semiconductor layer) having a low refractive index portion 175 of which the cross section in parallel to the substrate 105 is larger than the cross section of the microhole 170. The cross-sectional shape of the low refractive index portion is adjustable by changing conditions of the oxidizing process including processing time, vapor flow rate and thermal processing temperature. Here, the low refractive index portion is a circle having a diameter of 200 nm, for example.

After oxidation, as shown in FIG. 4, the fourth upper cladding layer 180 composed of the third semiconductor layer is formed by semiconductor crystal regrowth from the upper surface of the third upper cladding layer 165 (second semiconductor layer).

Generally, in MOCVD, growth parameters are controlled to allow the horizontal growth mode to be larger than the thickness growth mode.

Specifically, in the AlGaAs MOCVD, a diffusion length of 50 nm or higher can be achieved by making V/III larger (500 or less), reducing the growth pressure (to 100 mmHg or less) and increasing the growth temperature (750° C. or less).

After the microholes are planarized, the growth conditions are preferably reset to those of the general growth mode.

At this point, if necessary, the upper surface of the third upper cladding layer 165 may be cleaned and the microholes 170 may be filled with a low refractive index material such as resin. The fourth cladding layer 180 (third semiconductor layer) is for example, p-Al0.7Ga0.3As.

Next, the upper electrode 190 is formed on the fourth upper cladding layer and the lower electrode 195 is formed on the substrate 105.

According to the manufacturing steps described above, the hole formed in the semiconductor surface during regrowth is a microhole having an area smaller than the area of the low refractive index portion of two-dimensional photonic crystal structure. As compared with the case where the two-dimensional photonic crystal structure is formed directly from the semiconductor surface by etching without use of microholes, the semiconductor surface of this embodiment is flatter during regrowth so that the regrowth is easily conducted and the regrown crystal has high quality. This makes it possible to manufacture a photonic crystal surface-emitting laser having improved performance.

Here, in the forgoing description, the low refractive index portion of two-dimensional photonic crystal is formed by the method of using the plural microholes to form the oxidized area and thereby to form low refractive index portions 175 at a part of the second upper cladding layer 160 (first semiconductor layer). However, the method is not limited to this one. For example, the method may be such that using an etching liquid (for example, buffered hydrogen fluoride) capable of performing wet etching selectively depending on Al composition, the etching liquid is introduced via the microholes to form voids with the etching liquid and thereby forming the low refractive index portions 175.

Second Embodiment

Figure 5:
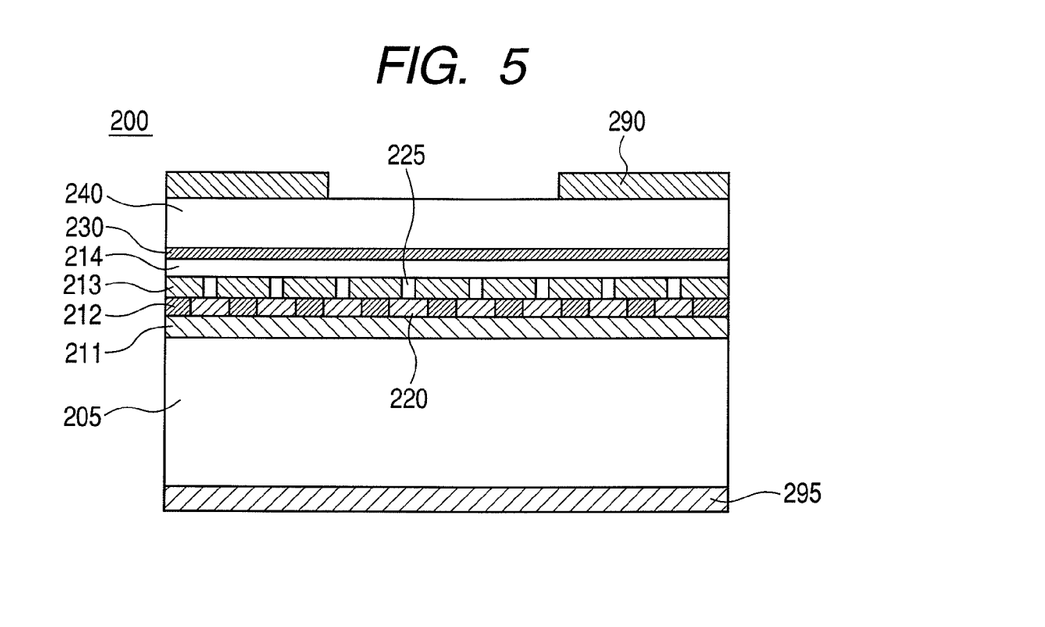
FIG. 5 is a schematic diagram for explaining the structure having an active layer in a semiconductor grown by crystal regrowth after formation of the photonic crystal structure in a second embodiment of the present invention.

Next, description is made about the method of manufacturing a surface-emitting laser according to the second embodiment of the present invention. FIG. 5 shows a schematic diagram for explaining the structure of the surface-emitting laser manufactured by the method of this embodiment.

In FIG. 5, the reference numeral 211 denotes a first lower cladding layer, 212 denotes a second lower cladding layer, 213 denotes a third lower cladding layer and 214 denotes a fourth lower cladding layer.

The reference numeral 220 denotes a low refractive index portion of photonic crystal structure, 225 denotes a microhole, 230 denotes an active layer, 240 denotes an upper cladding layer, 290 denotes an upper electrode and 295 denotes a lower electrode.

The present invention is not limited to the structure of the above-described first embodiment of the present invention, and as in this embodiment shown in FIG. 5, a semiconductor (third semiconductor layer) which is grown by crystal regrowth after formation of the photonic crystal structure may include the active layer.

In other words, although the active layer is placed below the photonic crystal structure in the surface-emitting laser 100 of FIG. 1, for example, as in the surface-emitting laser 200 shown in FIG. 5, the active layer 230 may be placed above the photonic crystal structures 212 and 220.

Here, the method of manufacturing the surface-emitting laser 200 of FIG. 5 is the same as the method of manufacturing the surface-emitting laser 100 of FIG. 1 except for the photonic crystal structure placed in the lower cladding layer.

On the substrate 205, the first lower cladding layer 211, the second lower cladding layer 212, and the third lower cladding layer 213 are laminated and the microhole 225 is formed in the third lower cladding layer 213. The microhole 225 is used to form the low refractive index portion 220 of the photonic crystal structure in the second lower cladding layer 212, and then, the third lower cladding layer 213, the fourth lower cladding layer 214, the active layer 230 and the upper cladding layer 240 are laminated on the second lower cladding layer 212.

Then, the upper electrode 290 and the lower electrode 295 are provided.

Figure 6:
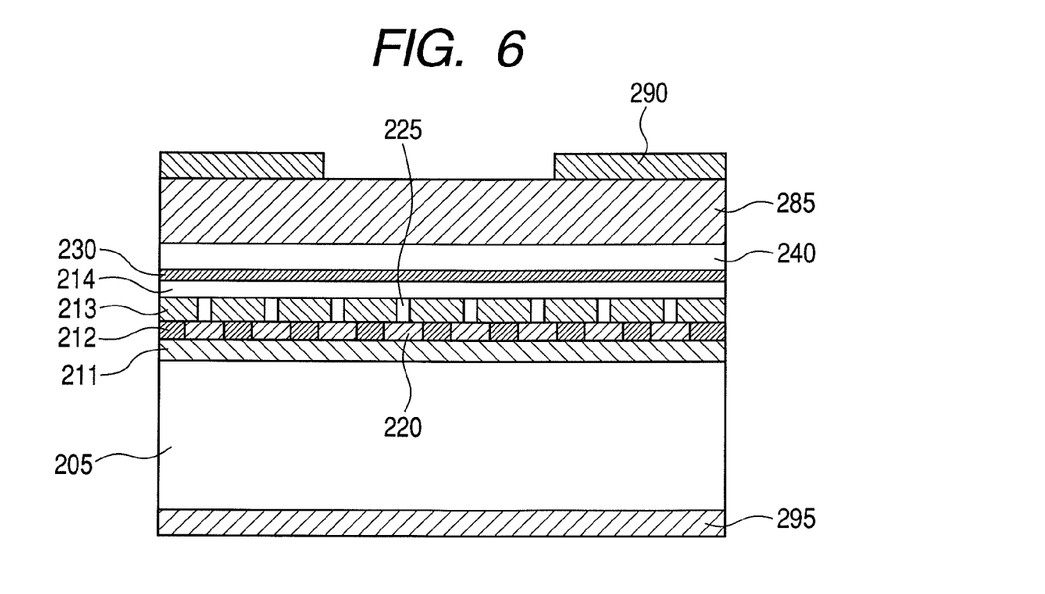
FIG. 6 is a schematic diagram for explaining a structural example in which a part of the cladding layer is replaced with a semiconductor multi-layer film reflecting mirror in order to increase confinement in the vertical direction in the surface-emitting laser manufactured by the second embodiment of the present invention.

Besides, as shown in FIG. 6, in order to increase confinement in the vertical direction, a part of the cladding layers may be replaced with a semiconductor multi-layer reflecting mirror 285.

Third Embodiment

Figure 7:
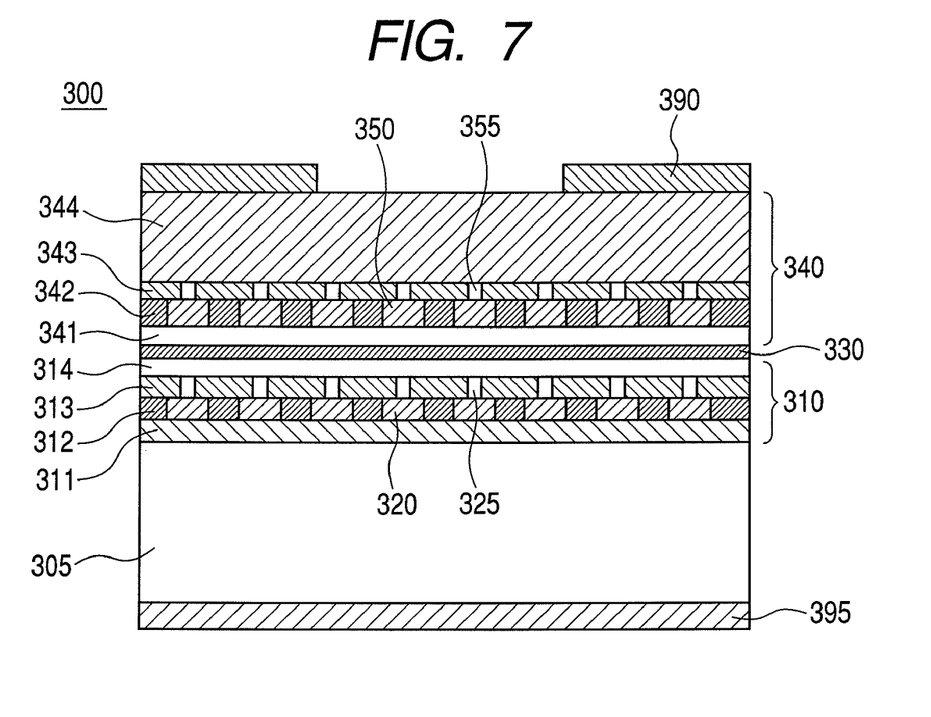
FIG. 7 is a schematic diagram for explaining the structure of a surface-emitting laser manufactured by a method according to a third embodiment of the present invention.

Next description is made about a method for manufacturing a surface-emitting laser according to the third embodiment of the present invention. FIG. 7 is a schematic diagram for explaining the structure of a surface-emitting laser manufactured by the method of this embodiment.

In FIG. 7, reference numeral 300 denotes a surface-emitting laser, 305 denotes a substrate, 310 denotes a lower cladding layer, 311 denotes a first lower cladding layer, 312 denotes a second lower cladding layer, 313 denotes a third lower cladding layer, and 314 denotes a fourth lower cladding layer. The reference numeral 320 denotes a low refractive index portion of the first photonic crystal structure, 325 denotes a microhole, 330 denotes an active layer, 340 denotes an upper cladding layer, 341 denotes a first upper cladding layer, 342 denotes a second upper cladding layer, 343 denotes a third upper cladding layer, and 344 denotes a fourth upper cladding layer. The reference numeral 350 denotes a low refractive index portion of the second photonic crystal structure, 355 denotes a microhole, 390 denotes an upper electrode and 395 denotes a lower electrode.

The surface-emitting laser 300 of this embodiment has, as shown in FIG. 7, the lower cladding layer 310, the active layer 330 and the upper cladding layer 340 laminated on the substrate 305. The lower cladding layer 310 has, from the substrate side, the first lower cladding layer 311, the second lower cladding layer 312 having the first photonic crystal structure formed having a plurality of low refractive index portions 320, the third lower cladding layer 313 having the microhole 325 formed therethrough, and the fourth lower cladding layer 314 having no microhole 325 formed.

In addition, the upper cladding layer 340 has, from the substrate side, the first upper cladding layer 341, the second upper cladding layer 342 provided with the second photonic crystal structure having a plurality of low refractive index portions 350, the third upper cladding layer 343 having the microhole 355 formed therethrough, and the fourth upper cladding layer 344 having no microhole formed.

Besides, there is formed on the surface of the fourth upper cladding layer 344 a ring-shaped upper electrode 390, and a lower electrode 395 is provided on the substrate 305.

With this surface-emitting laser 300, when a voltage is applied to between the electrodes 390 and 395 to make the active layer 330 emit light, and the light leaking from the active layer 300 resonates by the two two-dimensional photonic crystal structures to be amplified. With this structure, coherent light is surface-emitted from the upper surface of the fourth upper cladding layer 344.

Figure 8:
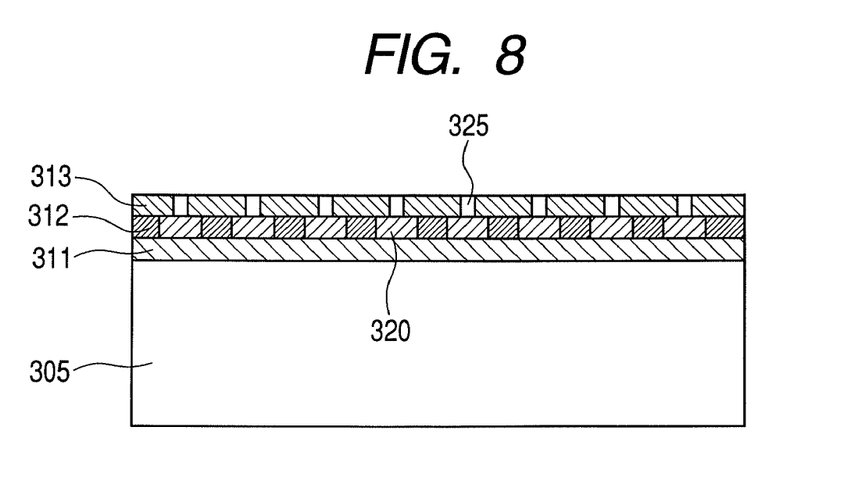
FIG. 8 is a schematic diagram for explaining the method for manufacturing a surface-emitting laser according to the third embodiment of the present invention.
Figure 9:
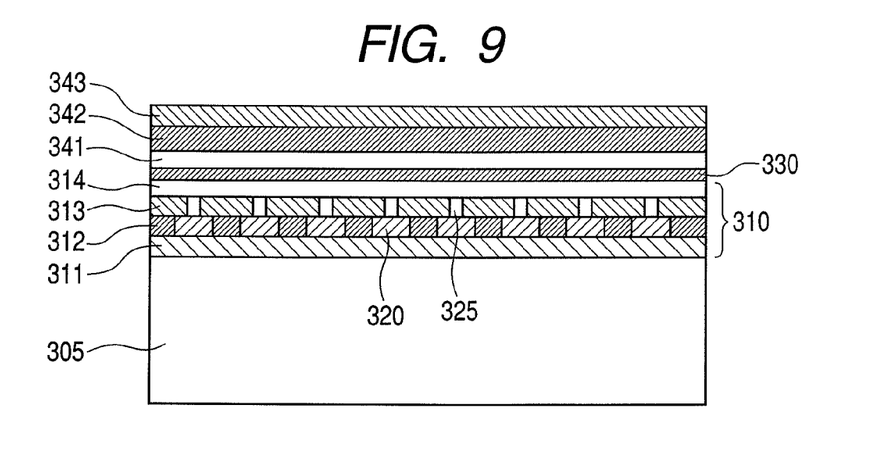
FIG. 9 is a schematic diagram for explaining the method for manufacturing a surface-emitting laser according to the third embodiment of the present invention.
Figure 10:
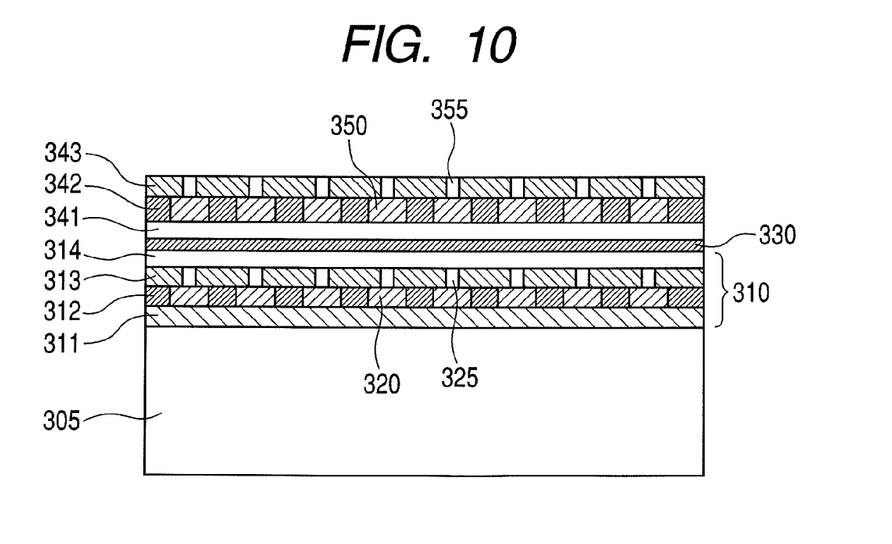
FIG. 10 is a schematic diagram for explaining the method for manufacturing a surface-emitting laser according to the third embodiment of the present invention.

Next description is made about the method for manufacturing a surface-emitting laser according to the third embodiment. FIGS. 8 to 10 are views for explaining the method for the manufacturing the surface-emitting laser 300 of this embodiment.

First, in the step of manufacturing the lower cladding layer 310, the first lower cladding layer 311, the second lower cladding layer 312 and the third lower cladding layer 313 are laminated sequentially on the substrate 305.

The second lower cladding layer has an Al compositional ratio higher than those of the first and third lower cladding layers.

Each layer is laminated by, MOCVD (Metal Organic Chemical Vapor Deposition), for example. The substrate 305 is an n-type semiconductor substrate, for example, n-GaAs substrate.

The first lower cladding layer 311 is an n-type AlGaAs, for example, n-Al0.7Ga0.3As.

The second lower cladding layer 312 is an n-type AlGaAs, for example, n-Al0.96Ga0.04As.

The third lower cladding layer 313 is an n-type AlGaAs, for example, n-Al0.5Ga0.5As.

Then, the microhole 325 is formed in the third lower cladding layer 313 and the second lower cladding layer 312.

More specifically, a resist is applied over the surface of the third lower cladding layer 313 to form a two-dimensional microhole pattern.

For example, the two-dimensional pattern is in the form of a tetragonal lattice and the lattice spacing is, for example, 250 nm. The diameter of the microhole is, for example, 50 nm. The resist having the two-dimensional microhole pattern formed therein is used as a mask to form the microhole 325 by the ICP etching method of introducing chlorine gas. The formation of the microhole 325 is so controlled that the microhole 325 penetrates through the third lower cladding layer 313 but does not reach the first lower cladding layer 311.

Then, the resist is removed, vapor is introduced via the microhole and thermal processing is performed at a temperature of 450° C. Then, as shown in FIG. 8, two-dimensional photonic crystal structure is formed in the second lower cladding layer 312. In other words, some parts of the second lower cladding layer 312 in contact with the microholes 325 are oxidized to form an Al oxide having a lower refractive index than that of the surrounding second lower cladding layer 312. This corresponds to the low refractive index portion 320 of the two-dimensional photonic crystal structure. Thus, the two-dimensional photonic crystal structure is formed in the second lower cladding layer 312 having the low refractive index portion 320 of which the cross section in parallel to the substrate 305 is larger than the cross section of the microhole 325. The cross-sectional shape of the low refractive index portion is adjustable by changing conditions of the oxidizing process including processing time, vapor flow rate and thermal processing temperature. Here, the low refractive index portion is a circle having a diameter of 200 nm, for example.

Next, oxidization treatment is performed, and then as shown in FIG. 9, from the upper surface of the third lower cladding layer 313 the fourth lower cladding layer 314, the active layer 330, the first upper cladding layer 341, the second upper cladding layer 342 and the third upper cladding layer 343 are formed by semiconductor crystal regrowth. At this point, if necessary, the upper surface of the third lower cladding layer 313 may be cleaned and the microhole 325 may be filled with a low refractive index material such as resin. The fourth lower cladding layer 314 is, for example, n-Al0.7Ga0.3As. The active layer 330 is, for example, GaInP/AlGaInP having a quantum well structure. The first upper cladding layer 341 is formed by p-type AlGaAs, for example, p-Al0.7Ga0.3As. The second upper cladding layer 342 in which the photonic crystal structure is formed is p-type AlGaAs, for example, p-Al0.96Ga0.04As. The third upper cladding layer 343 in which the microhole 355 is formed is formed by p-type AlGaAs, for example, p-Al0.7Ga0.3As.

Next, the microhole 355 is formed in the third upper cladding layer 343 and the second upper cladding layer 342. Specifically, a resist is applied over the surface of the third upper cladding layer 343 to form a two-dimensional microhole pattern. For example, the two-dimensional microhole pattern is in the shape of a tetragonal lattice and the lattice spacing is 250 nm, for example. The diameter of the microhole is 50 nm, for example. The resist having the two-dimensional microhole pattern formed therein is used as a mask to form the microhole 355 by the ICP etching method with use of chlorine gas. The formation of the microhole 355 is so controlled that the microhole 355 penetrates through the third upper cladding layer 343 but does not reach the first upper cladding layer 341.

Then, the resist is removed, the vapor is introduced via the microholes, and thermal processing is performed at a temperature of 450° C., for example, to form the two-dimensional photonic crystal structure in the second upper cladding layer 342, as shown in FIG. 10. More specifically, parts of the second upper cladding layer 342 in contact with the microhole 355 are oxidized to form an Al oxide having lower refractive index than that of the surrounding semiconductor layer. This corresponds to the low refractive index portion 350 of the two-dimensional photonic crystal structure. Thus, the two-dimensional photonic crystal structure is formed in the second upper cladding layer 342 having the low refractive index portions 350 of which the cross section in parallel to the substrate 305 is larger than the cross section of the microhole 355. The cross-sectional shape of the low refractive index portion is adjustable by changing conditions of the oxidizing process including processing time, vapor flow rate and thermal processing temperature. Here, the low refractive index portion is a circle having a diameter of 200 nm, for example.

Then, after oxidation treatment, the fourth upper cladding layer 344 is formed by semiconductor crystal regrowth from the upper surface of the third upper cladding layer 343. At this point, if necessary, the upper surface of the third upper cladding layer 343 may be cleaned and the microhole 355 may be filled with a low refractive index material such as resin. The fourth upper cladding layer 344 is, for example, p-Al0.7Ga0.3As. Then, the upper electrode 390 is formed on the fourth upper cladding layer 344, and the lower electrode 395 is formed on the substrate 305.

With the above described process, a two-dimensional photonic crystal surface-emitting laser is manufactured.

In the above-described manufacturing process, as in the first embodiment, the hole in the regrowth surface is a microhole having a cross section smaller than that of the low refractive index portion of the two-dimensional photonic crystal structure, and therefore, the regrowth is facilitated and the regrown crystal has high quality.

Figure 11:
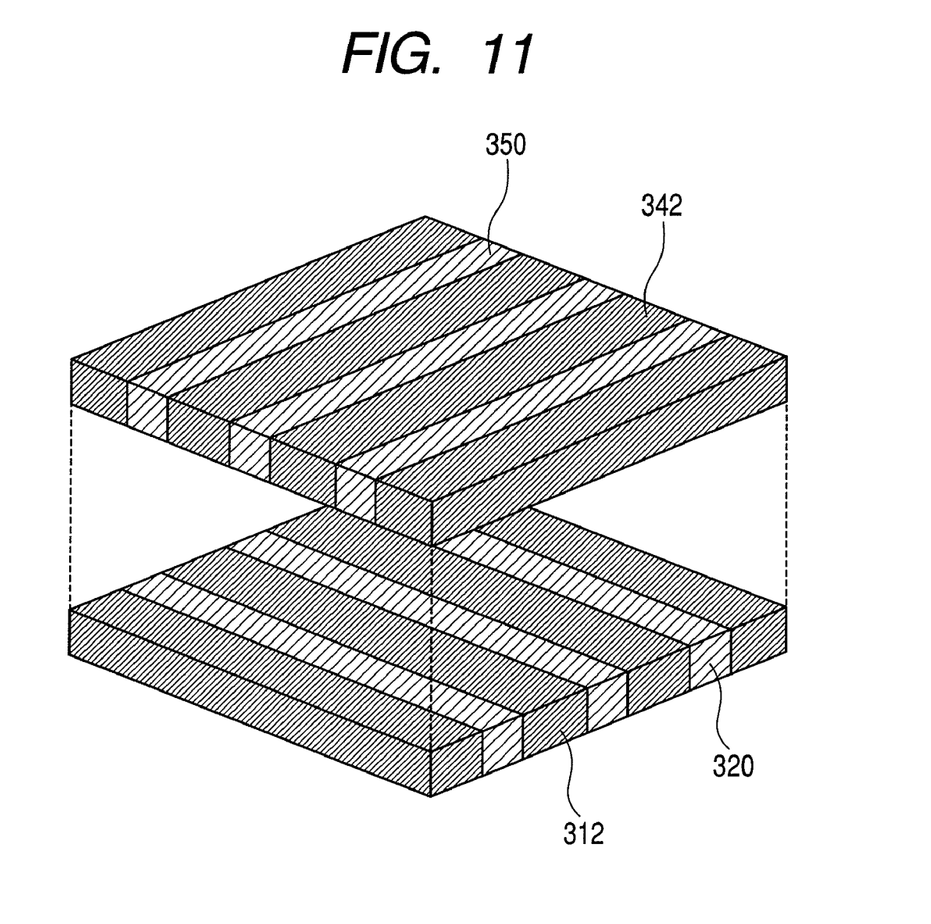
FIG. 11 is a schematic diagram for explaining a structural example of the surface-emitting laser in which one-dimensional photonic crystals having directions of refractive index distributions not in parallel to each other are combined thereby to allow two-dimensional resonance according to the third embodiment of the present invention.

In addition, since the two photonic crystal structures can be provided, the flexibility of device design can be increased. Here, various combinations of the two photonic crystal structures may be employed. For example, as shown in FIG. 11, even if the first photonic crystal structure and the second photonic crystal structure are of a combination of one-dimensional photonic crystals, two-dimensional resonance can be obtained unless the directions of refractive indexes are parallel. In this case, patterning of microholes 325, 355 in manufacturing the photonic crystal structure can be made by one-dimensional thin-line pattern, and therefore, the lithography process is more simple than that in the case of a two-dimensional pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Particularly, various modifications can be made in the refractive index pattern of the photonic crystal, material and shape of the semiconductor layers, photonic crystal structures and electrodes. For example, in each of the above-mentioned embodiments, the semiconductor layers are AlGaAs layers, which, however, may be changed to AlAs layers.

This application claims the benefit of Japanese Patent Application No. 2007-198489, filed Jul. 31, 2007, which is hereby incorporated by reference herein in its entirety.

What is claimed is:

1. A method for manufacturing a surface-emitting laser by laminating on a substrate a plurality of semiconductor layers including an active layer and a semiconductor layer having a photonic crystal structure formed therein, the method comprising the steps of:
   forming a second semiconductor layer on a first semiconductor layer to form the photonic crystal structure;
   forming a plurality of microholes in the second semiconductor layer;
   forming a low refractive index portion in a part of the first semiconductor layer via the plurality of microholes thereby to provide the first semiconductor layer with the photonic crystal structure having a one-dimensional or two-dimensional refractive index distribution in a direction parallel to the substrate; and
   forming a third semiconductor layer by crystal regrowth from a surface of the second semiconductor layer.

2. The method of claim 1, wherein the step of forming the low refractive index portion is performed by forming the first semiconductor layer with an AlGaAs layer or AlAs layer and introducing an oxidizing species through the microholes to form an oxidized area by the oxidizing species.

3. The method of claim 1, wherein the step of forming the low refractive index portion is performed by forming the first semiconductor layer with an AlGaAs layer or AlAs layer and introducing an etching liquid through the microholes to form a void by the etching liquid.

4. The method of claim 2, wherein the first semiconductor layer has an Al compositional ratio which is higher than that of the second semiconductor layer and higher than that of a semiconductor layer formed below the first semiconductor layer.

5. The method of claim 1, wherein the photonic crystal structure having the two-dimensional refractive index distribution is formed such that the microholes have a cross-sectional area in a direction parallel to the substrate which is smaller than the cross-sectional area of the low refractive index portion formed in the first semiconductor layer.

6. The method of claim 1, wherein the step of forming the third semiconductor layer includes formation of the active layer.

7. The method of claim 1, further comprising, after the step of forming the third semiconductor layer, a step of forming a second photonic crystal structure having a one-dimensional or two-dimensional refractive index distribution in a direction parallel to the substrate.

* * * * *